(12) United States Patent
Kubo et al.

(10) Patent No.: US 8,735,201 B2
(45) Date of Patent: May 27, 2014

(54) FILM-FORMING METHOD FOR FORMING PASSIVATION FILM AND MANUFACTURING METHOD FOR SOLAR CELL ELEMENT

(75) Inventors: Masashi Kubo, Kanagawa (JP); Makoto Kikuchi, Kanagawa (JP); Kazuya Saito, Chiba (JP); Miwa Watai, Chiba (JP); Miho Shimizu, Chiba (JP)

(73) Assignee: ULVAC, Inc., Kanagawa (JP)

( * ) Notice: Subject to any disclaimer, the term of this patent is extended or adjusted under 35 U.S.C. 154(b) by 127 days.

(21) Appl. No.: 13/142,138

(22) PCT Filed: Dec. 28, 2009

(86) PCT No.: PCT/JP2009/071767
§ 371 (c)(1),
(2), (4) Date: Aug. 9, 2011

(87) PCT Pub. No.: WO2010/074283
PCT Pub. Date: Jul. 1, 2010

(65) Prior Publication Data
US 2011/0294256 A1    Dec. 1, 2011

(30) Foreign Application Priority Data
Dec. 26, 2008    (JP) .................................. 2008-335051

(51) Int. Cl.
*H01L 21/00* (2006.01)

(52) U.S. Cl.
USPC ................. 438/57; 438/72; 438/98; 136/243; 136/244; 136/252

(58) Field of Classification Search
CPC ................... H01L 31/02008; H01L 31/02021; H01L 31/02167; H01L 31/022425; H01L 31/022441
USPC ....................... 438/48–98; 136/243, 244, 252
See application file for complete search history.

(56) References Cited

U.S. PATENT DOCUMENTS

| 2005/0189015 A1* | 9/2005 | Rohatgi et al. ................. 136/261 |
| 2006/0019477 A1* | 1/2006 | Hanawa et al. ............... 438/514 |

FOREIGN PATENT DOCUMENTS

| JP | 56-045760 A | 4/1981 |
| JP | 59-30130 B2 | 7/1984 |

(Continued)

OTHER PUBLICATIONS

Supplemental Search Report dated Aug. 7, 2013, Application No. 09835076.2 (PCT/JP2009071767).

(Continued)

*Primary Examiner* — Khiem D Nguyen
(74) *Attorney, Agent, or Firm* — Arent Fox LLP

(57) ABSTRACT

The challenge for the present invention is to provide a film-forming method and for forming a passivation film which can sufficiently inhibit the loss of carriers due to their recombination; and a method for manufacturing a solar cell element with the use of the method or the device. The film-forming device comprises a mounting portion 22 for mounting a film-forming object, a high frequency power source 25, and a shower plate 23 which is provided to face the film-forming object S mounted on the mounting portion 22, which introduces a film-forming gas, and to which the high frequency power source is connected and a high frequency voltage is applied. A low frequency power source 26 for applying a low frequency voltage is connected to the shower plate or the mounting portion mounting a substrate. The film-forming method is performed using the film-forming device, and the film-forming method is carried out in forming a passivation film.

3 Claims, 6 Drawing Sheets

(56) References Cited

FOREIGN PATENT DOCUMENTS

| | | | | |
|---|---|---|---|---|
| JP | 08-339992 | * | 12/1996 | ............ H01L 21/31 |
| JP | 08-339992 A | | 12/1996 | |
| JP | 09-298193 | * | 11/1997 | ............ H01L 21/31 |
| JP | 09-298193 A | | 11/1997 | |
| JP | 11-233292 A | | 8/1999 | |
| JP | 10032493 A | | 8/1999 | |
| JP | 2005-159171 A | | 6/2005 | |
| WO | WO 2006/137322 A1 | | 12/2006 | |

OTHER PUBLICATIONS

Hans Ekhult, European Patent Office, Supplemental European Search Report—EP Application No. 09 83 5076, dated Aug. 7, 2013, Europe.

* cited by examiner

FILM-FORMING METHOD FOR FORMING PASSIVATION FILM AND MANUFACTURING METHOD FOR SOLAR CELL ELEMENT

CROSS-REFERENCED TO RELATED APPLICATION

This application is a National Stage entry of International Application No. PCT/JP2009/071767, filed on Dec. 28, 2009, which claims priority to Japanese Patent Application 2008-335051, filed Dec. 26, 2008. The disclosure of the prior application is hereby incorporated in its entirety by reference.

TECHNICAL FIELD

This invention relates to a film-forming method for a passivation film, and a manufacturing method for a solar cell element.

BACKGROUND ART

A solar cell element, attracting attention as a clean source of energy, is required to reduce a loss in output characteristics for increased output characteristics. The causes of the loss in the output characteristics of the solar cell element include optical losses, for example, a reflection loss and a transmission loss, and electrical losses, for example, the loss of carriers due to their recombination and an ohmic loss.

Patent Document 1, for example, discloses a solar cell element equipped with a semiconductor layer, a passivation film formed on the semiconductor layer, and an electrode, wherein an oxygen-surplus region is formed between the semiconductor layer and the passivation layer, in order to inhibit (i.e., reduce) the reflection loss and the loss of carriers due to the their recombination. For this purpose, a passivation film is formed after the surface of a semiconductor is processed with a nitrogen plasma. The passivation film refers to a film which functions as a protective film for protecting the semiconductor layer, and also functions as an anti-reflection coating film.

PRIOR ART DOCUMENTS

Patent Documents

Patent Document 1: JP-A-2005-159171 (claim 1, claim 7, etc.)

SUMMARY OF THE INVENTION

Problems to be Solved by the Invention

However, even when the oxygen-surplus region is formed by forming the passivation film after nitrogen plasma processing, the problem is posed that the loss of carriers due to their recombination in the solar cell element cannot be fully inhibited (i.e., reduced), if the film quality of the passivation film itself is not satisfactory.

The challenge for the present invention is, therefore, to solve the above-mentioned problem of the conventional technology, thereby providing a film-forming method and for forming a passivation film for a solar cell element, the passivation film being capable of sufficiently inhibiting the loss of carriers due to their recombination. The present invention is also directed to providing a method for manufacturing a solar cell element using the same.

Means for Solving the Problems

The film-forming method of the present invention is a film-forming method which comprises introducing a film-forming gas containing silicon and at least one species selected from nitrogen and oxygen, and applying a high frequency voltage from a high frequency power source, with a shower plate for introduction of the film-forming gas serving as a discharge electrode, to generate a plasma, thereby forming a passivation film on a solar cell element provided with a diffusion layer, and further comprising applying a low frequency voltage from a low frequency power source to the shower plate or the diffusion layer during film formation, thereby forming the passivation film on the diffusion layer. In the film-forming method of the present invention, the film is formed on the film-forming object by applying the high frequency voltage from the high frequency power source during film formation, while further applying the low frequency voltage to the shower plate or the film-forming object from the low frequency power source. By so doing, the film quality of the film, namely the film density and the fixed charge density in film, is improved. When the resulting film is used, for example, as a passivation film for a solar cell element, the loss of carriers due to their recombination can be fully inhibited in accordance with an improvement in film quality.

It is preferred that with the low frequency power source applying the low frequency voltage to the shower plate, the passivation film be formed on the diffusion layer. The reason is that the film-forming speed is increased by forming the passivation film for a solar cell element on the film-forming object while applying the low frequency voltage to the shower plate.

Moreover, the inputting power of the low frequency power source is preferably 14 to 37% of the inputting power of the high frequency power source. Within this range, film quality is further improved, and the loss of carriers due to their recombination can be fully inhibited.

A method for manufacturing a solar cell element according to the present invention comprises a diffusion layer formation step of forming a diffusion layer on a surface of a semiconductor substrate, a passivation film formation step of forming a passivation film on the diffusion layer, and an electrode formation step of forming a grid electrode on the passivation film, and then further forming a back electrode on the other surface of the semiconductor substrate, followed by heating, to connect the grid electrode to the diffusion layer, and is characterized in that the passivation film formation step introduces a film-forming gas containing silicon and at least one species selected from nitrogen and oxygen, and applies a high frequency voltage from a high frequency power source, with a shower plate for introduction of the film-forming gas serving as a discharge electrode, and also applies a low frequency voltage from a low frequency power source to the shower plate or the semiconductor substrate having the diffusion layer formed thereon, to generate a plasma, thereby forming the passivation film on the diffusion layer. In the method for manufacturing a solar cell element according to the present invention, the high frequency voltage is applied from the high frequency power source, and the low frequency voltage is applied from the low frequency power source to the shower plate or the semiconductor substrate having the diffusion layer formed thereon. By so doing, the film quality of the passivation film, namely the film density and the fixed charge density in the film, can be rendered high, whereby the loss of carriers due to their recombination in the solar cell element can be fully inhibited.

Effects of the Invention

According to the film-forming device for forming a passivation film and the film-forming method for forming a passivation film in the present invention, the film quality of the resulting passivation film is satisfactory, and the loss of carriers due to their recombination in a solar cell element can be inhibited. Thus, the excellent effect of improving output characteristics can be exhibited. According to the manufacturing method for a solar cell element of the present invention, the film quality of the passivation film is satisfactory, so that the loss of carriers due to their recombination can be inhibited. This produces the excellent effect of improving output characteristics.

MODES FOR CARRYING OUT THE INVENTION

Figure 1:
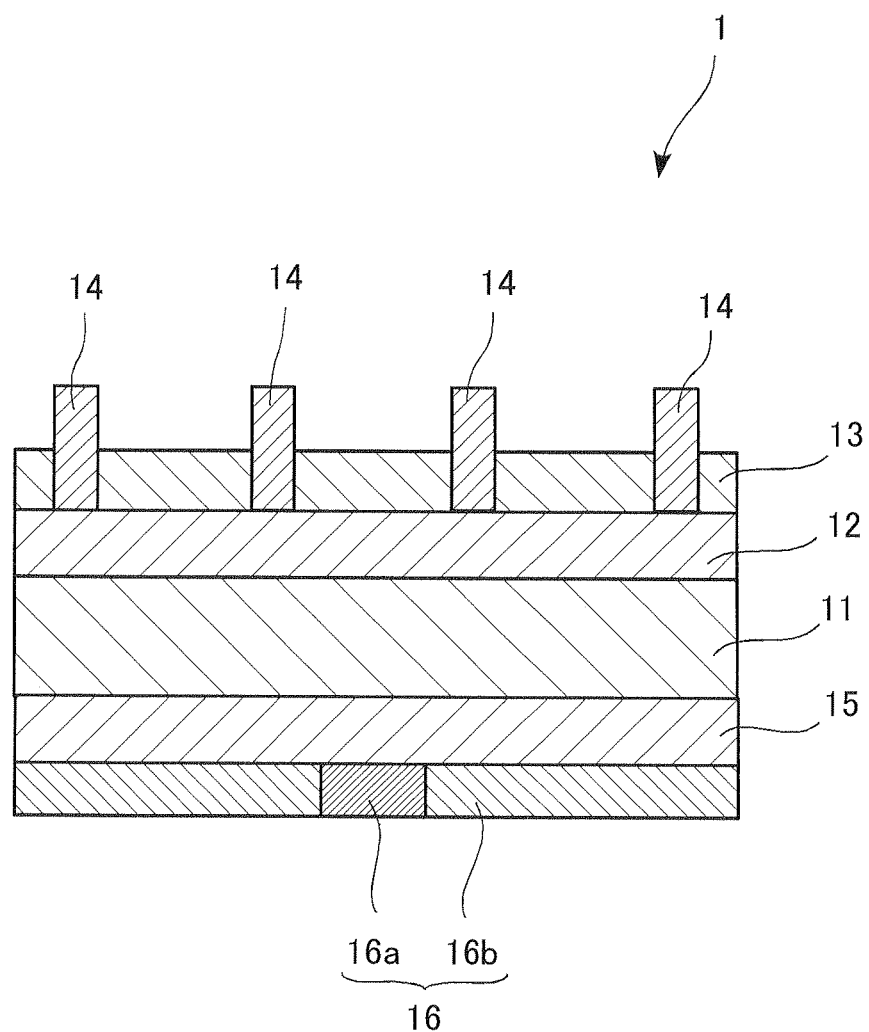
[FIG. 1] is a schematic sectional view of a solar cell element.

First of all, a solar cell element will be described. A solar cell element 1, which is a unit cell of a solar cell, has a p-type semiconductor substrate 11. The p-type semiconductor substrate 11 has irregularities (not shown) provided on its surfaces by texture etching. An n-type diffusion layer 12 is provided on one surface of the p-type semiconductor substrate 11. The n-type diffusion layer 12 is formed, for example, by coating the surface of the p-type semiconductor substrate 11 with a paint containing phosphorus, and then heat-treating the coating. A passivation layer 13 is formed on the surface of the n-type diffusion layer 12.

The passivation layer 13 comprises a film (passivation film) which is one of a silicon nitride film (SiN), a silicon oxide film (SiO), and a silicon oxynitride film (SiON). This passivation film is formed by a film-forming method of the present embodiment to be described later. Since the passivation film is formed by the film-forming method of the present embodiment, its film quality is improved. As a result, the lifetime of carriers, which is named as an indicator of whether the recombination of carriers is suppressed, is lengthened. That is, the loss of carriers is inhibited. Thus, the output efficiency in the solar cell element 1 is increased.

The passivation layer 13 is provided with a grid electrode 14. The grid electrode 14 is provided on the passivation film, and then heated to pierce the passivation film and connect to the n-type diffusion layer 12. On the other surface of the p-type semiconductor substrate 11, a BSF layer 15 and a back electrode layer 16 are provided in this order. The BSF layer 15 is a high concentration p-type diffusion layer, and the BSF layer is formed simultaneously with the formation of the back electrode layer 16. The back electrode layer 16 consists of a first back electrode layer 16a which functions as a p-type impurity supply source for a p$^+$ layer and as a grid electrode, and a second back electrode layer 16b which functions as a current collecting electrode for current collection from the entire back of the solar cell. The first back electrode layer 16a is formed by coating aluminum only or a paste containing aluminum, followed by baking, so that aluminum ions diffuse into the element to provide the p-type impurity supply source for the p$^+$ layer. The second back electrode layer 16b is composed of low resistance silver.

An explanation will be offered for a film-forming device which carries out a film-forming method for forming the passivation film to be used in this solar cell element. A film-forming device 2 is designed to form a passivation film by performing the plasma CVD method. The film-forming device 2 is equipped with a vacuum chamber 21 which can hold a desired vacuum state. The vacuum chamber 21 is provided with a mounting stand 22 equipped with a heating device (not shown). A film-forming object S, which comprises a plurality of the p-type semiconductor substrates 11 arranged side by side and each having the n-type diffusion layer 12 formed thereon, is mounted on the mounting stand 22. The heating device can adjust this film-forming object S to a desired substrate temperature during film formation.

On the ceiling surface of the vacuum chamber 21, a shower plate 23 is provided to face the film-forming object S. A gas introduction means 24 for introducing a film-forming gas is connected to the shower plate 23. The gas introduction means 24, in the present embodiment, is configured to be capable of introducing three gases, for example. In the gas introduction means 24, gas sources 24a, 24b, 24c having different gases (in the present embodiment, $SiH_4$, $NH_3$, $N_2$) sealed up therein, respectively, are connected to a gas introduction pipe 24d via valves 24e. In the present embodiment, the gas introduction means 24 is configured to be capable of introducing the three gases, but may be configured to have six gas sources, for example, and select a gas in accordance with the film constitution so that the selected gas can be introduced in accordance with the desired film constitution.

Moreover, a high frequency power source 25 is connected to the shower plate 23 so as to apply a high frequency voltage to the shower plate 23. Thus, the shower plate 23 functions as a gas inlet for introducing the film-forming gas into the vacuum chamber 21 uniformly, and also functions as a discharge electrode upon application of the high frequency voltage.

In the present embodiment, moreover, the mounting stand 22 is provided with a low frequency power source 26 so that a low frequency voltage can be applied toward the film-forming object S. That is, the film-forming device 2 of the present embodiment is configured to be capable of applying voltages of different frequencies from the high frequency power source 25 and the low frequency power source 26 during film formation, thereby forming a plasma to render film formation possible.

The film-forming method using the film-forming device 2 will be described. First, the film-forming object S is mounted on the mounting stand 22 within the vacuum chamber 21. Then, the interior of the vacuum chamber 21 is brought to a desired vacuum state. The film-forming gas is introduced from the gas introduction means 24, and voltages are applied from the high frequency power source 25 and the low frequency power source 26 to generate a plasma, thereby forming a passivation film on the film-forming object S. In the present embodiment, the passivation film is formed, with the voltages being applied from the high frequency power source 25 and the low frequency power source 26, whereby the passivation film of a satisfactory film quality can be formed. Consequently, the lifetime of the solar cell element 1 using this film can be increased.

As the film-forming gas, $SiH_4$ is introduced as a Si-containing gas, and one gas or more gases selected from $NH_3$, $N_2$ and $NF_3$ is or are introduced as a N-containing gas, in forming a silicon nitride film as the passivation film. In forming a silicon oxide film as the passivation film, $SiH_4$ is introduced as a Si-containing gas, and one gas or more gases selected from $N_2O$ and $O_2$ is or are introduced as an O-containing gas. When the silicon oxynitride film is to be formed, $SiH_4$ is introduced as a Si-containing gas, one or more gases selected from $NH_3$, $N_2$ and $NF_3$ are introduced as a N-containing gas, and one or more gases selected from $N_2O$ and $O_2$ are introduced as an O-containing gas. Furthermore, an inert gas, for example, an Ar gas, may be incorporated as a carrier gas into the film-forming gas. When the SiN film is to be used as the passivation film, for example, the flow rate of each gas is 1500 to 1600 sccm for $SiH_4$, 3000 to 6000 sccm for $NH_3$, and 4000 to 7000 sccm for $N_2$.

The high frequency power source 25 may be one which can apply a voltage at a high frequency of 13.56 to 27.12 MHz, while the low frequency power source 26 may be one which can apply a voltage at a low frequency of 20 to 400 kHz.

The inputting power of the high frequency power source 25 is 1000 to 3500 W. The inputting power of the low frequency power source 26 is 300 to 2000 W, preferably 500 to 1250 W. Moreover, it is preferred that the inputting power of the low frequency power source 26 be about 14 to 37%, preferably about 26 to 34%, of the inputting power of the high frequency power source 25. When the inputting power of the low frequency power source 26 is within this range relative to the inputting power of the high frequency power source 25, a passivation film of better film quality can be formed, whereby the lifetime of the solar cell element can be increased. As a result, the output characteristics of the solar cell element can be improved.

Other film-forming conditions for the passivation film are as follows: Substrate temperature: 380 to 420° C., pressure within vacuum chamber: 100 to 250 Pa, substrate-to-shower plate distance (E/S): 12 to 25 mm.

The passivation film formed under the above-described film-forming conditions requires a film-forming time of 25 seconds, has a film thickness of 800 Å, and has a refractive index of 1.9 to 2.2. The lifetime of the solar cell element 1 provided with this film is 1,000 μs or more, and may be 2,500 μs or even more. Thus, it is seen that a loss in carriers due to their recombination is inhibited.

Next, another embodiment of the film-forming device 2 will be described using FIG. 3. FIG. 3 is a schematic view showing an alternative embodiment of the film-forming device. In a film-forming device 3 according to this alternative embodiment, a low frequency power source 26 is provided for a shower plate 23 provided with a high frequency power source 25. Even when the low frequency power source 26 is provided on the side of the shower plate 23 as noted above, the effect can be obtained that a film of the same satisfactory film quality as that by the aforementioned film-forming device 2 can be formed under the same film-forming conditions. Furthermore, the different film-forming device 3 shown in FIG. 3 is advantageous in that its film-forming rate or speed is higher than that of the film-forming device 2 shown in FIG. 2. That is, the present invention has the low frequency power source provided for either the shower plate 23 which functions as a cathode electrode contributing to the generation of plasma within the vacuum chamber 21, or the mounting stand 22 which functions as an anode electrode. By applying a low frequency voltage to one of them while applying a high frequency voltage by the high frequency power source, the film quality of the passivation film can be improved, whereby the loss of carriers due to their recombination in the solar cell element is inhibited.

With a plasma which has hitherto been formed by applying only a voltage of a high frequency (13.56 MHz to 27.12 MHz), plasma density and plasma potential have been determined by conditions for generation of plasma, such as the type of the gas, the inputting power, and the electrode-to-electrode distance. Under the film-forming conditions involving a high speed of 30 Å/s or higher, film quality necessary for the solar cell element, represented by film density and fixed charge in the film, has not been successfully obtained. With the conventional passivation film, therefore, the loss of carriers due to their recombination has failed to be sufficiently inhibited.

With the present embodiment, on the other hand, voltages of different frequencies, i.e., a high frequency and a low frequency, are superposed and applied to form the passivation film, so that the passivation film has satisfactory film quality, for example, as the solar cell element 1, concretely, high film density and high fixed charge density in the film. In detail, the charge of ions excited by the low frequency voltage is added to the charge of the plasma excited by the high frequency voltage, whereby the potential difference between the substrate and the plasma, namely, sheath electric field, can be increased. As a result, ion energy incident on the surface of the substrate can be increased. With the increase in the ion energy, ion bombardment of the substrate surface by the incident ions is also enhanced. Thus, the passivation film is formed more densely (high film density), and the charge present in the passivation film also increases. Consequently, the passivation film has a high positive fixed charge density.

Since such a passivation film is formed, positive carriers (holes) moved toward the interface of the passivation film are repelled and pushed back. Thus, hole density can be decreased even at the interface with a high defect density. Hence, the recombination of carriers can be suppressed, and the lifetime of carriers can be lengthened.

In the film-forming device of the each embodiment, the low frequency power source for applying a low frequency voltage is connected to the shower plate or the mounting portion, so that the film quality of the resulting film (i.e., film density and fixed charge density or concentration in film) is improved. The use of the resulting film, for example, as a passivation film for a solar cell element makes it possible to fully inhibit the loss of carriers due to their recombination in accordance with the improvement of the film quality. And, the film-forming rate or speed becomes high because the high frequency power source and the low frequency power source are connected to the shower plate.

Hereinafter, the present invention will be described in more detail by Examples.

EXAMPLE 1

Figure 2:
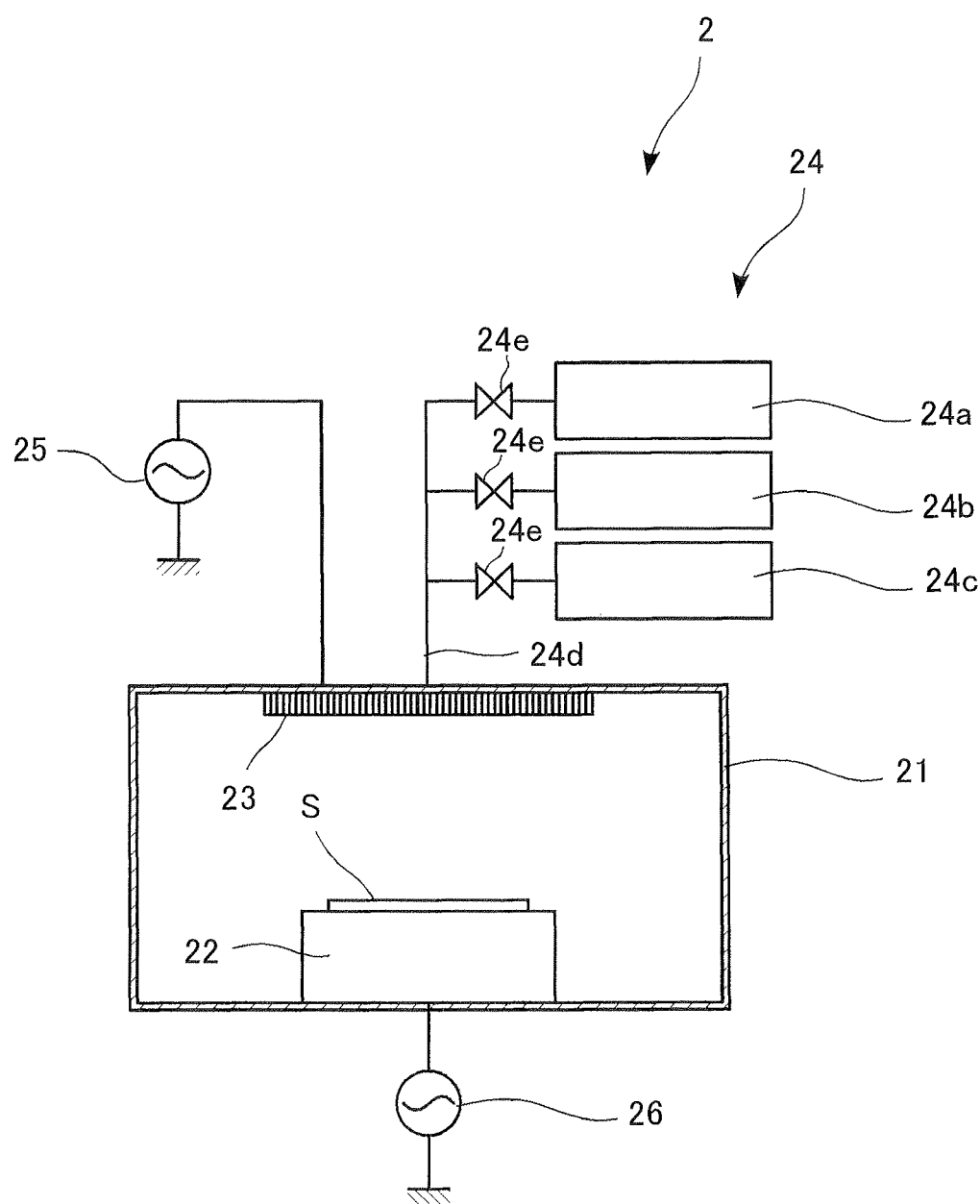
[FIG. 2] is a schematic view of a film-forming device according to the present embodiment.
Figure 3:
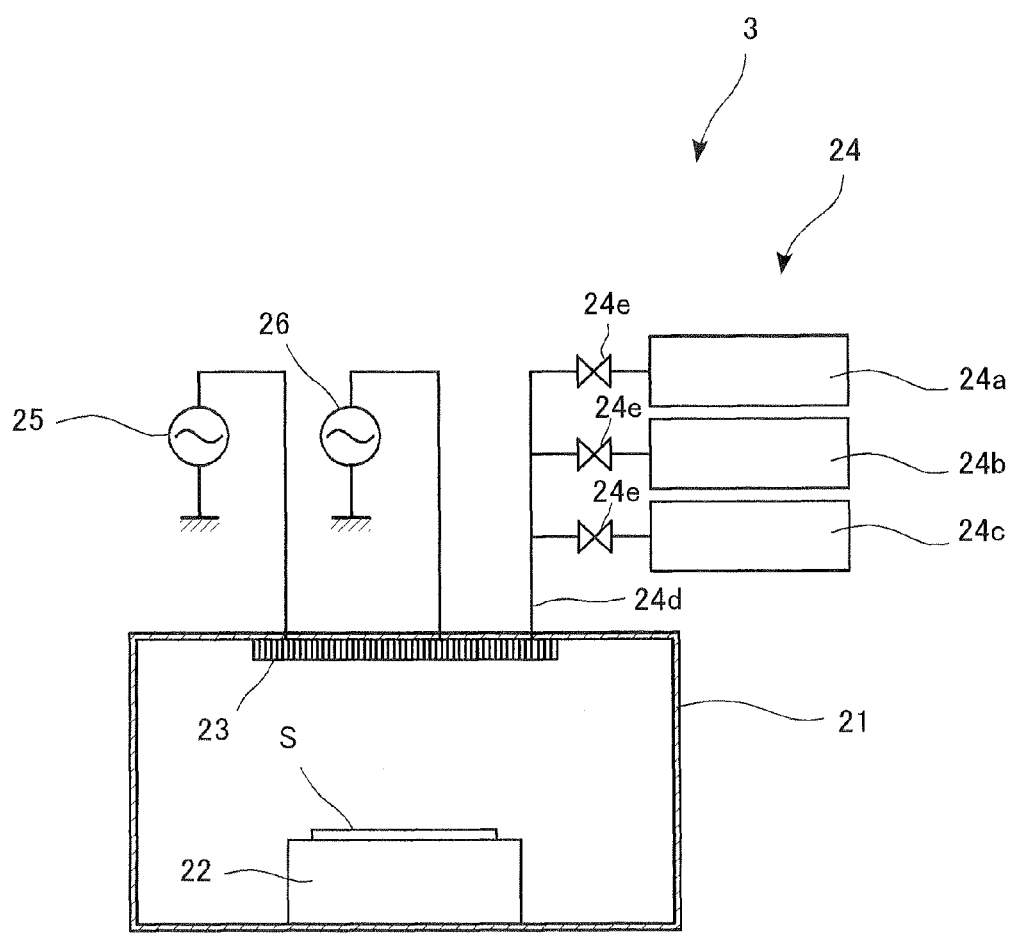
[FIG. 3] is a schematic view of a film-forming device according to another embodiment.

In the present example, a passivation film was formed using the film-forming device 2 shown in FIG. 2, whereafter a solar cell element was prepared.

First, an n-type diffusion layer 12 was formed on a surface of a 220 μm thick p-type semiconductor substrate 11 (156 mm×156 mm) of monocrystal silicon having irregularities provided on the surface by texture etching. A plurality of the so treated substrates 11 were arranged side by side on a tray to provide a film-forming object S.

Then, the film-forming object S was carried into the film-forming device 2 shown in FIG. 2, and a passivation film comprising a silicon nitride film was formed under the following conditions: Substrate temperature: 350° C., $SiH_4$ flow rate: 1500 sccm, $NH_3$ flow rate: 5000 sccm, $N_2$ flow rate: 6000 sccm, frequency of the high frequency power source 25:

13.56 MHz, inputting power of the high frequency power source 25: 1500 W, pressure within the vacuum chamber: 100 Pa, E/S: 14 mm, frequency of the low frequency power source: 300 kHz, inputting power of the low frequency power source 26: 500 W.

Then, the film-forming object S having the passivation film formed thereon was taken out of the film-forming device 2, and a silver paste was coated in a lattice pattern on the passivation film to a thickness of 10 µm by the screen printing method. Then, the coating was dried for 10 minutes at 150° C to form a grid electrode film.

Then, a silver paste was coated on the back to a thickness of 10 µm by the screen printing method, followed by drying for 10 minutes at 150° C, to form a first back electrode film. Then, an aluminum paste was coated to a thickness of 10 µm by the screen printing method, followed by drying for 10 minutes at 150° C, to form a second back electrode film. Finally, the film-forming object S was heat-treated for 3 seconds at 750° C to convert the first back electrode film and the second back electrode film into a first back electrode layer 16a and a second back electrode layer 16b, respectively. Moreover, a BSF layer 15 was formed between the back electrode layer 16 and the p-type semiconductor substrate 11. The grid electrode film pierced the passivation film to come into contact with the n-type diffusion layer 12, forming a grid electrode 14. In this manner, a solar cell element 1 having the passivation film formed as a passivation layer 13 by the film-forming device 2 was obtained.

EXAMPLE 2

In the present example, a solar cell element 1 was produced under exactly the same conditions as those in Example 1, except that the inputting power of the low frequency power source 26 was set at 1000 W.

EXAMPLE 3

In the present example, a solar cell element 1 was produced under exactly the same conditions as those in Example 1, except that a passivation film was formed using the film-forming device 3 shown in FIG. 3.

EXAMPLE 4

In the present example, a solar cell element 1 was produced under exactly the same conditions as those in Example 3, except that the inputting power of the low frequency power source 26 was set at 1000 W.

The lifetimes of the solar cell elements 1 obtained in Examples 1 to 4 were measured with a lifetime measuring device (produced by KOBELCO Research Institute, Inc.) using the microwave photoconductivity decay method. The results of the measurements are shown in FIG. 4.

Figure 4:
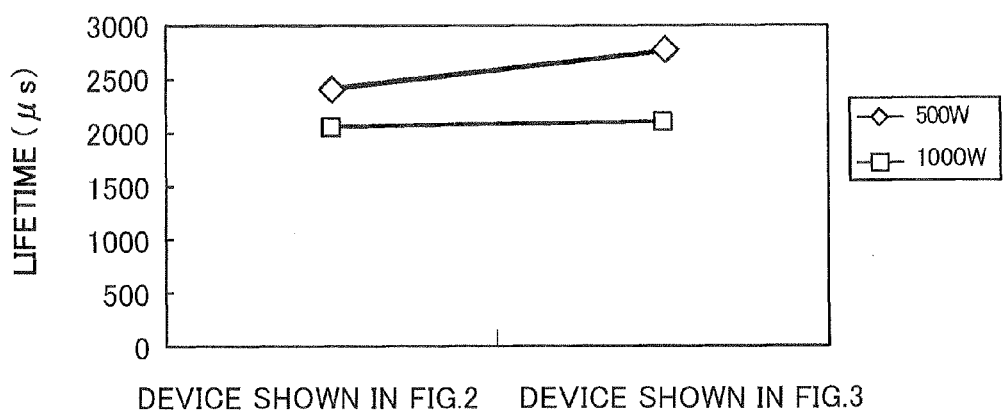
[FIG. 4] is a graph showing the results of Examples 1 to 4.

As shown in FIG. 4, when the inputting power of the low frequency power source 26 was 1000 W, the device shown in FIG. 2 and the device shown in FIG. 3 both presented lifetimes of almost 2000 µs. In the case of 500 W, the film-forming device 2 shown in FIG. 2 and the film-forming device 3 shown in FIG. 3 both presented lifetimes in excess of 2000 µs, but the lifetime was slightly higher with the film-forming device 3 shown in FIG. 3. Usually, the lifetime of a solar cell element is of the order of 1000 µs, so that the results on the film-forming device 2 shown in FIG. 2 and the film-forming device 3 shown in FIG. 3 were both improved, i.e., lengthened, as compared with the value of the conventional solar cell element.

In the present embodiment, therefore, the high frequency power source 25 and the low frequency power source 26 were provided and, with a high frequency voltage and a low frequency voltage being applied, the passivation film was formed. Consequently, a passivation film of satisfactory film quality could be formed, whereby the lifetime of the solar cell element could be increased.

EXAMPLE 5

In the present example, passivation films were formed using the film-forming device 3 shown in FIG. 3, with the inputting power of the low frequency power source 26 being varied, whereafter solar cell elements were prepared. That is, solar cell elements 1 were prepared under exactly the same conditions as those in Example 3, except that the inputting powers of the low frequency power source were set at 0 W, 500 W and 1000 W, respectively, in forming the passivation films.

The lifetimes of the resulting solar cell elements were measured by the microwave photoconductivity decay method. The results of the measurements are shown in FIG. 5.

Figure 5:
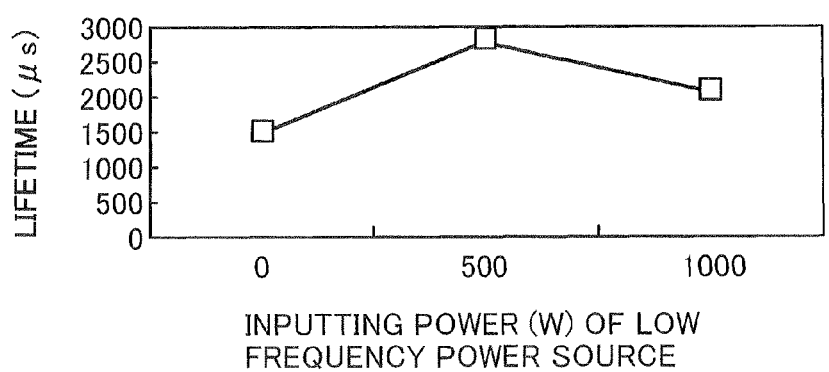
[FIG. 5] is a graph showing the results of Example 5.

As shown in FIG. 5, when the inputting power of the low frequency power source 26 was 500 W, the lifetime was the longest, exceeding 2500 µs. The lifetime was longer when the inputting power of the low frequency power source 26 was 1000 W, than when it was zero, namely, when the low frequency power source 26 was not provided; that is, the lifetime was 2000 µs. Based on these results, when the inputting power of the low frequency power source 26 was 250 to 1000 W, namely, when the inputting power of the low frequency power source 26 was about 16 to 67% of the inputting power of the high frequency power source 25, the lifetime exceeded 2000 µs. Particularly, when the inputting power of the low frequency power source 26 was 400 to 700 W, namely, when the inputting power of the low frequency power source 26 was about 26 to 45% of the inputting power of the high frequency power source 25, the lifetime exceeded 2500 µs, providing better results.

EXAMPLE 6

In the present example, passivation films were formed, and solar cell elements were produced, under the same conditions as those in Example 3, except that the inputting power of the high frequency power source 25 was changed, and the inputting power of the low frequency power source 26 was changed. That is, solar cell elements 1 were prepared under exactly the same conditions as those in Example 3, except that the inputting power of the high frequency power source 25 was set at 3500 W, while the inputting powers of the low frequency power source 26 were set at 500 W, 1000 W, 1500 W and 1900 W, respectively.

The lifetimes of the solar cell elements 1 obtained in Example 6 were measured by the microwave photoconductivity decay method. The results of the measurements are shown in FIG. 6.

Figure 6:
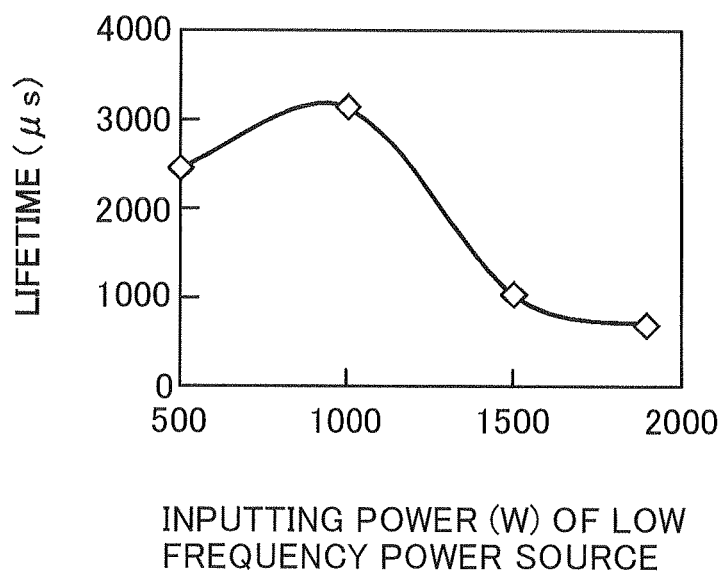
[FIG. 6] is a graph showing the results of Example 6.

As shown in FIG. 6, when the inputting power of the low frequency power source was 1000 W, the lifetime was the longest, exceeding 3000 µs. When the inputting powers of the low frequency power source 26 were 1500 W and 1900 W, the lifetimes were of the order of 1000 µs. Based on these results, when the inputting power of the low frequency power source 26 was 500 to 1500 W, namely, when the inputting power of the low frequency power source 26 was about 14 to 37% of the inputting power of the high frequency power source 25, the lifetime exceeded 2000 µs. Particularly when the inputting power of the low frequency power source 26 was 550 to 1200 W, namely, when the inputting power of the low frequency power source 26 was about 15 to 34% of the inputting power of the high frequency power source 25, the lifetime exceeded 2500 μs, providing better results.

The results of Examples 5 and 6 show that the inputting power of the low frequency power source 26 was preferably about 14 to 37% of the inputting power of the high frequency power source 25, and that the inputting power of the low frequency power source 26 was particularly preferably about 26 to 34% of the inputting power of the high frequency power source 25.

EXAMPLE 7

In the present example, a passivation film comprising a silicon nitride film was formed in exactly the same manner as in Example 1, except that the following changes were made: $SiH_4$ flow rate: 3000 sccm, $NH_3$ flow rate: 1800 sccm, and $N_2$ flow rate: 2500 sccm.

EXAMPLE 8

In the present example, a passivation film comprising a silicon nitride film was formed in exactly the same manner as in Example 7, except that the inputting power of the low frequency power source 26 was changed to 1000 W.

Example 9

In the present example, film formation was performed under exactly the same conditions as in Example 7, except that the film-forming device 3 was used. Then, the thickness of the film was measured.

EXAMPLE 10

In the present example, film formation was performed under exactly the same conditions as in Example 8, except that the film-forming device 3 was used. Then, the thickness of the film was measured.

The film obtained in each of the Examples was measured for film thickness with an ellipsometer (ESM-3000AT, ULVAC, Inc.). The measured film thickness was divided by the film-forming time to determine the film-forming speed. The results are shown in FIG. 7.

Figure 7:
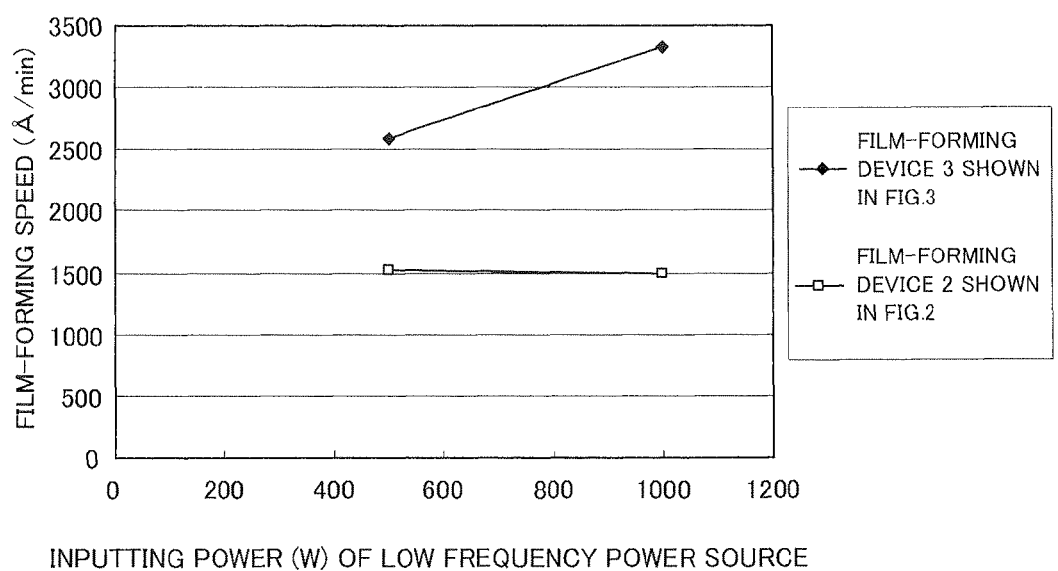
[FIG. 7] is a graph showing the results of Examples 7 to 10.

As shown in FIG. 7, even under the same film-forming conditions, the film-forming speed was higher when the film was formed using the film-forming device 3 than when the film was formed using the film-forming device 2. Hence, it was found that a high frequency voltage and a low frequency voltage were preferably applied to the shower plate 23, as in the film-forming device 3.

The passivation film obtained by the film-forming method and the film-forming device in the present embodiment can be utilized, for example, as a passivation film of an organic EL device or the like, but is preferably used as a passivation film of a solar cell element, as in the present embodiment.

INDUSTRIAL APPLICABILITY

The present invention can be utilized in the field of production of a solar cell element.

DESCRIPTION OF THE NUMERALS

1 Solar cell element
2 Film-forming device
3 Film-forming device
11 P-type semiconductor substrate
12 N-type diffusion layer
13 Passivation layer
14 Grid electrode
15 BSF layer
16 Back electrode layer
16a First back electrode layer
16b Second back electrode layer
21 Vacuum chamber
22 Mounting stand
23 Shower plate
24 Gas introduction means
24a, 24b, 24c Gas source
24d Gas introduction pipe
24e Valve
24 Gas introduction means
25 High frequency power source
26 Low frequency power source
S Film-forming object

The invention claimed is:

1. A film-forming method, comprising:
introducing a film-forming gas containing silicon and at least one species selected from nitrogen and oxygen into a vacuum chamber adapted to hold a solar cell element, through a shower plate; and
applying a high frequency voltage from a high frequency power source having a set frequency of 13.56 to 27.12 MHz, with the shower plate for introduction of the film-forming gas serving as a discharge electrode, to generate a plasma between the shower plate and the solar cell element, thereby forming a passivation film on the solar cell element provided with a diffusion layer,
further comprising applying a low frequency voltage from a low frequency power source having a set frequency of 20 to 400 kHz, to the shower plate or the diffusion layer during film formation, herewith generating the plasma while applying the high frequency voltage and the low frequency voltage to the film-forming gas between the shower plate and the solar cell element, thereby forming the passivation film having a positive fixed charge density on the diffusion layer,
wherein an inputting power of the low frequency power source is 14 to 37% of an inputting power of the high frequency power source.

2. The film-forming method according to claim 1, wherein the passivation film is formed on the diffusion layer, with the low frequency power source applying the low frequency voltage to the shower plate.

3. A method for manufacturing a solar cell element, comprising:
a diffusion layer formation step of forming a diffusion layer on a surface of a semiconductor substrate;
a passivation film formation step of forming a passivation film having a positive fixed charge density on the diffusion layer; and
an electrode formation step of forming a grid electrode on the passivation film, and then further forming a back electrode on another surface of the semiconductor substrate, followed by heating, to connect the grid electrode to the diffusion layer,
wherein the passivation film formation step introduces a film-forming gas containing silicon and at least one species selected from nitrogen and oxygen, and applies a high frequency voltage from a high frequency power source having a set frequency of the high frequency power source of 13.56 to 27.12 MHz, with a shower plate for introduction of the film-forming gas serving as a discharge electrode, and also applies a low frequency voltage from a low frequency power source having a set frequency of the low frequency power source of 20 to 400 kHz to the shower plate or the semiconductor substrate having the diffusion layer formed thereon, to generate a plasma, thereby forming the passivation film having the positive fixed charge density on the diffusion layer, and wherein an inputting power of the low frequency power source is 14 to 37% of an inputting power of the high frequency power source.

* * * * *